(12) United States Patent
Searls et al.

(10) Patent No.: US 6,580,608 B1
(45) Date of Patent: Jun. 17, 2003

(54) METHOD AND APPARATUS FOR THERMALLY CONTROLLING MULTIPLE ELECTRONIC COMPONENTS

(75) Inventors: Damion T. Searls, Portland, OR (US); Terrance J. Dishongh, Hillsboro, OR (US); James D. Jackson, Beaverton, OR (US); Thomas O. Morgan, Hillsboro, OR (US); Roth O. Weston, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/023,820

(22) Filed: Dec. 21, 2001

(51) Int. Cl.[7] .................................................. H05K 7/20
(52) U.S. Cl. ..................... 361/690; 165/80.2; 165/80.3; 165/185; 361/707; 361/710; 361/719; 257/707; 257/713
(58) Field of Search ............................... 165/80.2, 80.3, 165/185; 174/16.3, 16.1, 15.1; 257/706–707, 712–713, 714, 722; 361/688–697, 704, 707–708, 709–710, 717–721; 363/141, 144

(56) References Cited

U.S. PATENT DOCUMENTS

| | | | |
|---|---|---|---|
| 3,277,346 A | * 10/1966 | Mcadam et al. | ............. 361/695 |
| 5,072,787 A | * 12/1991 | Nakamichi | ................. 165/80.3 |
| 5,586,004 A | * 12/1996 | Green et al. | ................ 361/715 |
| 6,046,906 A | 4/2000 | Tseng | |
| 6,215,662 B1 | 4/2001 | Peter et al. | |

* cited by examiner

Primary Examiner—Gregory Thompson
(74) Attorney, Agent, or Firm—Antonelli, Terry, Stout & Kraus, LLP

(57) ABSTRACT

A method and apparatus to thermally control multiple electronic components, such as field-effect transistors for voltage regulation in processors and chipsets in computers, allow more effective convective cooling by grouping the electronic components in an at least essentially closed loop configuration about a passageway which is open at both ends to permit air flow therethrough. The electronic components form respective side walls of the passageway or are in heat conducting relation with the side walls of a heat sink which forms the passageway. Mounting the electronic components to stand upright off the motherboard allows air to enter below the components and rise up through the passageway producing an increase in air speed and better convective cooling.

25 Claims, 3 Drawing Sheets

METHOD AND APPARATUS FOR THERMALLY CONTROLLING MULTIPLE ELECTRONIC COMPONENTS

FIELD

The invention relates to thermal control of electronic components such as field-effect transistors used in voltage regulations in power silicon products including processors and chipsets in computers. Improved thermal control is attained with the invention in a cost-effective manner which allows a relatively large number of electronic components to be placed per unit foot print area of the motherboard while lowering operating temperatures of the components.

BACKGROUND

Electronic components, such as field-effect transistors used for voltage is regulation in processors and chipsets in computers, generate heat commensurate with the electrical power dissipated thereby. As processor and chipset power increases, the power dissipated by these components also increases which provides its own set of thermal control challenges. To meet these challenges, in some high-power applications, field-effect transistors are designed to stand upright off their circuit board, also known as a motherboard, to avoid excessive motherboard heating. Electronic components have also been provided with a heat conductive backing, typically made of metal, for dissipating the heat generated by the component. In addition, upright field-effect transistors are sometimes placed next to one another to form "sandwiches". FIG. 1 illustrates a typical, prior art field-effect transistor sandwich configuration wherein first and second field effect transistors 1 and 2, each having a metal backing member 4, are located next to one another with a heat sink 5 therebetween. Electrical leads 6, 7 and 8 on each of the field-effect transistors, couple the components to the board.

The heat generating electrical components in U.S. Pat. No. 6,215,662 are each provided with a relatively large heat sink having a main panel and side/fin panels that includes slots to permit air flow therethrough. To reduce the area of the motherboard for accommodating a plurality of these components with large heat sinks, a heat sink of one component is interleaved with that of a neighboring heat sink of a second component. Cooling air is forced, as by use of a fan, to flow through the slots provided in the side panels of the heat sinks. The side panels of the heat sinks are close to each other and their slots are aligned to aid air flow.

U.S. Pat. No. 6,046,906 discloses a vent chimney heat sink designed for an electrical assembly wherein a heat sink is in direct contact with a first integrated circuit on a substrate for removing heat therefrom. Heat generated by a second integrated circuit on the board in spaced relation to the first integrated circuit is removed by convective heat transfer from a top surface of the second integrated circuit to an air flow through a channel provided in the heat sink adjacent the second integrated circuit. A fan is employed to generate the air flow.

There is a need for an improved method and apparatus for low cost thermal control of multiple heat-generating electronic components such as field-effect transistors which allow more components to be placed closer together while simultaneously lowering operating temperatures of the components.

BRIEF DESCRIPTION OF THE DRAWINGS

The file of this patent contains at least one drawing executed as a color photograph. Copies of this patent with color photographs will be provided by the Patent and Trademark Office upon request and payment of the necessary fee.

The following represents brief descriptions of the drawings, wherein.

DETAILED DESCRIPTION

Figure 1:
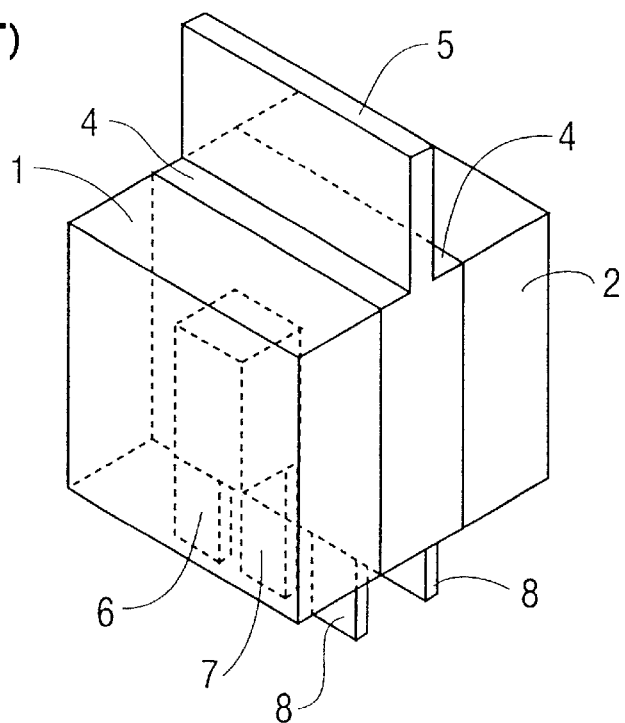
FIG. 1 is an isometric view of a conventional "sandwich" configuration of two field-effect transistors wherein the housing is made transparent to show one of the embedded heat sources.

Referring now to the drawings, an apparatus 9 of an example embodiment of the invention comprises a plurality of electronic components 10–13 to be thermally controlled. The apparatus further comprises a passageway 14 which is open at opposite, upper and lower ends 15 and 16 thereof. The passageway is formed with heat conductive side walls 17–20 in a closed, or at least essentially closed, loop configuration about the passageway. The heat-generating electronic components 10–13, field-effect transistors in the example embodiment, are located at respective ones of the side walls. Each of the electronic components has a heat conductive backing member, 21–24 which can form one of the side walls of the passageway. Alternatively, as shown in the example embodiment, the heat conductive side walls are portions of a heat sink 25 which forms the passageway. Each of the plurality of electronic components 10–13 is arranged in heat conducting relation with one of the side walls of the heat sink. The heat sink 25 and heat conductive backing members 21–24 are formed of metal, particularly copper, in the example embodiment, but other thermally conductive materials could be used.

A soldered connection is made between the heat conductive backing member of each electronic component and its corresponding side wall of the heat sink 25 to connect the components and side walls in heat conducting relation. The electronic components are preferably arranged outside of the passageway 14 to avoid interfering with the airflow through the passage, but a component or components could be located within the passageway on its corresponding side wall. The at least essentially closed loop configuration of the heat conductive side walls is preferably a polygon having at least three sides, although in the example embodiment, a box-shaped configuration is employed.

Figure 2:
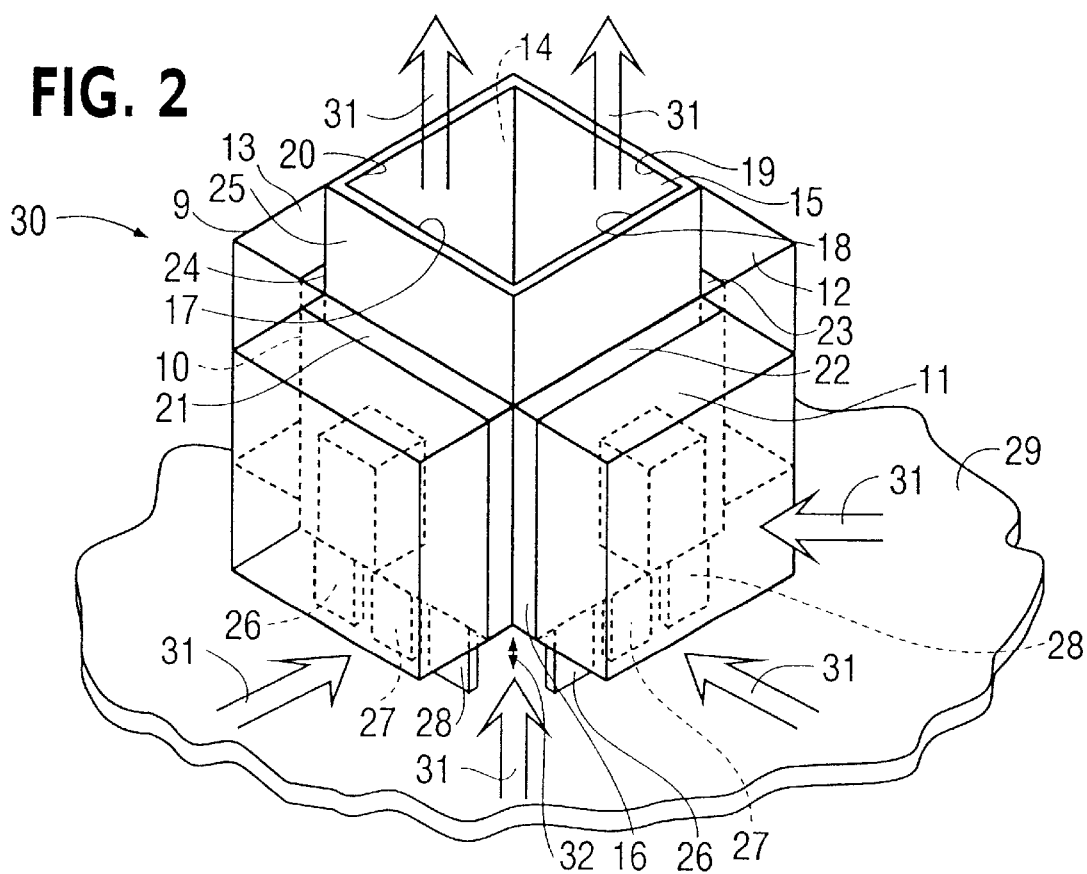
FIG. 2 is an isometric view of a field-effect transistor box apparatus according to an example embodiment of the invention comprising four field-effect transistors wherein the field-effect transistor housing is made transparent to show two of the embedded heat sources.

The electronic components 10–13 each have three electrical leads 26–28 extending therefrom beyond the lower, open end of the passageway to allow the components and passageway to stand upright off a substrate 29 to which the components are coupled. When the apparatus 9 is coupled to the substrate, a circuit board in the example embodiment, particularly a motherboard, an electronic assembly 30 according to the invention is formed. The standoff allows air to enter through a small gap 32, having a height of about 1 mm, for example, below the components and their backing members and rise through the passageway 14 producing a chimney effect causing an increase in air speed. The air flow is shown by directional arrows 31 in FIG. 2. The gap or standoff 32 is preferably only tall enough to allow for air flow beneath the components into the passageway.

Figure 3:
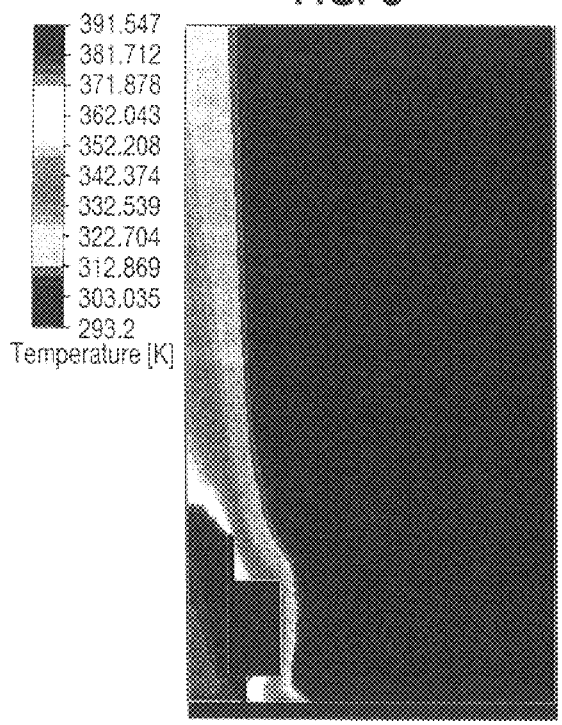
FIG. 3 is a thermal profile of a field-effect transistor of the box apparatus of FIG. 2 obtained by modeling.
Figure 4:
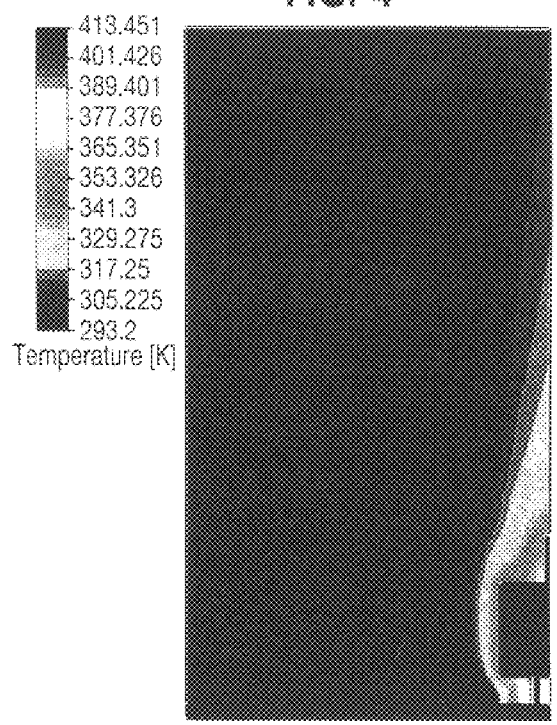
FIG. 4 is a thermal profile of a field-effect transistor in the sandwich configuration of FIG. 1 obtained by modeling.

A significant benefit of the at least essentially closed loop configuration of the side walls of the passageway in the apparatus 9 of the invention is that it allows for effective natural convective cooling of a grouping of heat-generating electronic components, e.g., field-effect transistors in the example embodiment. FIGS. 3 and 4 give a comparison of the thermal performance of the field-effect transistor box configuration according to the example embodiment of the invention versus the "sandwich" configuration of the prior art as discussed with reference to FIG. 1. The data in FIGS. 3 and 4 was gathered using software to simulate heat transfer through natural convection and conduction.

A relatively simple model was used in this simulation because a relative comparison was the only goal of interest. The apparatus shown in FIGS. 1 and 2 were used for the analysis. That is, the sandwich configuration modeled was the same as an individual field-effect transistor in the apparatus of FIG. 2, however, the heat sink the two field-effect transistors share in the sandwich configuration was double the thickness of the heat sink 25 of FIG. 2.

Figure 5:
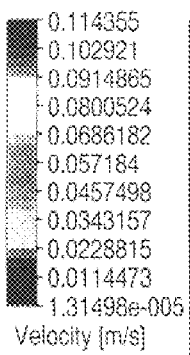
FIG. 5 is an air velocity profile for a field-effect transistor in the box apparatus of FIG. 2 obtained by modeling.
Figure 5:
Figure 6:
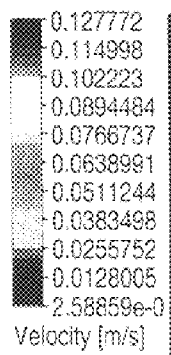
FIG. 6 is an air velocity profile for a single field-effect transistor obtained by modeling.
Figure 6:

The results of the simulation and modeling show a 16% improvement (273 K baseline) in max temperature with the apparatus of the invention compared with the sandwich configuration of the prior art. It is believed that much of the improvement is due to the effect of the box-shaped heat sink. The field-effect transistors standing off the motherboard allow air to enter below the transistors and rise up through the interior of the box, producing a "chimney" effect. This results in generally higher air speeds over most of the heat sink surface. This improves convection cooling. This effect is seen in the comparison between FIGS. 5 and 6 wherein the air velocity contours between the field-effect transistor box and a lone field-effect transistor have been analyzed.

The closed loop configuration of the present invention also allows for more electronic components to be placed on the motherboard per unit foot print area. In the example embodiment of FIG. 2, there are four field-effect transistors in a 2×2 cm area (one field-effect transistor/cm$^2$). However, in the prior art of FIG. 1 there are two field-effect transistors in a 1×2.75 cm area (0.727 field-effect transistor/cm$^2$). Therefore, the closed loop configuration of the apparatus of the present invention allows more field-effect transistors to be placed closer together while simultaneously lowering operating temperatures. Thus, the effectiveness of natural convective cooling of a grouping of electronic components is optimized in a cost-effective manner with the present invention While we have shown and described only one example embodiment in accordance with the present invention, it is understood that the same is not limited thereto, but is susceptible to numerous changes and modifications as known to those skilled in the art. For example, electronic components other than field-effect transistors, could be thermally controlled with the invention. Natural convection cooling is utilized in the example embodiment but the movement of air could be further enhanced using a fan, for example, to aid air flow above and/or below the upwardly extending passageway of the invention. Therefore, we do not wish to be limited to the details shown or described herein, but intend to cover all such changes and modifications as are encompassed by the scope of the appended claims.

We claim:

1. An apparatus to thermally control electronic components comprising:

a passageway open at opposite ends thereof, with heat conductive side walls in an at least essentially closed loop configuration about the passageway; and a plurality of heat-generating electronic components at respective ones of the side walls;

wherein the electronic components have leads extending therefrom beyond one of the open ends of the passageway to allow the components and passageway to stand off a substrate to permit air to flow below the components and rise through the passageway when the components are coupled to the substrate to form an electronic assembly.

2. The apparatus according to claim 1, wherein each of the plurality of electronic components has a heat conductive backing member which forms one of the side walls.

3. The apparatus according to claim 1, wherein the heat conductive side walls are portions of a heat sink which forms the passageway, each of the plurality of electronic components being arranged in heat conducting relation with one of the side walls of the heat sink.

4. The apparatus according to claim 3, wherein the electronic components are arranged outside of the passageway.

5. The apparatus according to claim 1, wherein the closed loop configuration is a polygon having at least three sides.

6. The apparatus according to claim 1, wherein the electronic components are field-effect transistors.

7. The apparatus according to claim 1, wherein the closed loop configuration is box-shaped.

8. An electronic assembly comprising:

a substrate;

a plurality of heat-generating electronic components coupled with the substrate, each component having a heat conductive backing member arranged substantially perpendicular to a plane of the substrate; and wherein the components are arranged on the substrate such that the backing members thereof are in an at least essentially closed loop configuration about a passageway which extends substantially perpendicular to the plane of the substrate and which is open at both ends thereof, a lower one of said open ends facing said substrate and being spaced therefrom by a gap which permits air to enter below the components and their backing members and rise through the passageway for cooling the electronic assembly.

9. The electronic assembly according to claim 8, wherein the backing members of the electronic components form the side walls of the passageway.

10. The electronic assembly according to claim 8, further comprising a heat sink which forms the passageway, the backing member of each of the plurality of electronic components being arranged in heat conducting relation with one of the side walls of the heat sink.

11. The electronic assembly according to claim 8, wherein the closed loop configuration is a polygon having at least three sides.

12. The electronic assembly according to claim 8, wherein the electronic components are field-effect transistors.

13. An electronic assembly comprising:

a substrate;

a plurality of heat-generating electronic components coupled with the substrate, each component having a heat conductive backing member arranged substantially perpendicular to a plane of the substrate; and wherein the components are arranged on the substrate such that the backing members thereof are in an at least essentially closed loop configuration about a passageway which extends substantially perpendicular to the plane of the substrate and which is open at both ends thereof; and wherein the electronic components have leads extending therefrom which couple the components with the substrate such that the components and the backing members thereof stand off the surface of the substrate to allow air to enter below the components and their backing members and rise through the passageway producing a chimney effect causing an increase in air speed.

14. The electronic assembly according to claim 8, wherein the closed loop configuration is box-shaped.

15. The electronic assembly according to claim 8, wherein the substrate is a circuit board.

16. A method of thermally controlling multiple electronic components comprising:

conducting heat generated by each of a plurality of heat-generating electronic components to respective ones of heat conductive side walls in an at least essentially closed loop configuration about a passageway; and allowing air to flow through the passageway and convection cool the electronic components; and wherein said method includes coupling the electronic components to a substrate so they stand off the substrate to permit air to flow below the components and rise through the passageway producing a chimney effect causing an increase in speed of air flowing through the passageway.

17. The method according to claim 16, including forming the heat conductive side walls of the passageway with respective ones of the plurality of electronic components.

18. The method according to claim 16, wherein the heat conductive side walls are portions of a heat sink which forms the passageway, the method further comprising arranging each of the plurality of electronic components in heat conducting relation with one of the side walls of the heat sink.

19. The method according to claim 18, including arranging the electronic components outside of the passageway.

20. The method according to claim 16, wherein the closed loop configuration is a polygon having at least three sides.

21. The method according to claim 16, wherein the electric components are field-effect transistors.

22. An apparatus to thermally control electronic components comprising:

a substrate;

a plurality of heat-generating electronic components coupled to the substrate to stand upright off the substrate by way of leads of the components;

wherein the components are arranged in an at least essentially closed loop configuration about a passageway which extends substantially perpendicular to the substrate and which is open at both ends thereof, the lower open end of the passageway facing said substrate and being spaced therefrom by a gap which allows air to flow below the components and rise through the passageway for cooling the components.

23. The apparatus according to claim 22, wherein the electronic components form respective side walls of the passageway.

24. The apparatus according to claim 22, further comprising a heat sink which forms the passageway, each of the plurality of electronic components being arranged in heat conducting relation with the heat sink.

25. The apparatus according to claim 22, wherein the at least essentially closed loop configuration is a polygon having at least three sides.

* * * * *